United States Patent
Iwasaki (10) Patent No.: US 9,813,068 B2
(45) Date of Patent: Nov. 7, 2017

(54) SPREAD SPECTRUM CLOCK GENERATOR, ELECTRONIC APPARATUS, AND SPREAD SPECTRUM CLOCK GENERATION METHOD

(71) Applicant: Keiichi Iwasaki, Kanagawa (JP)

(72) Inventor: Keiichi Iwasaki, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 222 days.

(21) Appl. No.: 14/872,236

(22) Filed: Oct. 1, 2015

(65) Prior Publication Data
US 2016/0099719 A1    Apr. 7, 2016

(30) Foreign Application Priority Data

Oct. 3, 2014  (JP) .................. 2014-204495
Jul. 21, 2015  (JP) .................. 2015-143581

(51) Int. Cl.
| | | |
|---|---|---|
| *H03L 7/00* | (2006.01) | |
| *H03L 7/08* | (2006.01) | |
| *H03K 4/06* | (2006.01) | |
| *H03L 7/081* | (2006.01) | |
| *H03L 7/10* | (2006.01) | |
| *H03K 3/64* | (2006.01) | |

(Continued)

(52) U.S. Cl.
CPC ............ *H03L 7/0805* (2013.01); *H03K 4/06* (2013.01); *H03L 7/081* (2013.01); *H03K 3/64* (2013.01); *H03K 3/78* (2013.01); *H03L 7/06* (2013.01); *H03L 7/10* (2013.01); *H03L 7/16* (2013.01)

(58) Field of Classification Search
None
See application file for complete search history.

(56) References Cited

U.S. PATENT DOCUMENTS

| | | | |
|---|---|---|---|
| 5,355,098 A | 10/1994 | Iwasaki | |
| 5,631,920 A * | 5/1997 | Hardin | .................. H03B 29/00 375/130 |

(Continued)

FOREIGN PATENT DOCUMENTS

| | | |
|---|---|---|
| JP | 2002-281252 | 9/2002 |
| JP | 2009-081840 | 4/2009 |

(Continued)

*Primary Examiner* — Tuan T Lam
(74) *Attorney, Agent, or Firm* — Harness, Dickey & Pierce, P.L.C.

(57) ABSTRACT

A spread spectrum clock generator includes a phase comparator that compares a reference clock with a feedback clock, a low-pass filter that passes a predetermined low-frequency component, a phase lock loop that includes a voltage-controlled oscillator generating an output clock whose frequency corresponds to the filtered signal, a triangular wave controller that generates a triangular wave signal for frequency-modulating the spread spectrum clock based on the output clock, a delay controller that generates the feedback clock by controlling delay of the output clock based on the triangular wave signal, a first counter that counts the output clock and output a first count value, a second counter that counts the reference clock and output a second count value, and a phase error correction circuit that compares the first count value with the second count value and corrects phase error of the output clock.

7 Claims, 6 Drawing Sheets

(51) Int. Cl.
  *H03L 7/06*     (2006.01)
  *H03L 7/16*     (2006.01)
  *H03K 3/78*     (2006.01)

(56)         References Cited

U.S. PATENT DOCUMENTS

| | | | |
|---|---|---|---|
| 2003/0039330 A1* | 2/2003 | Castiglione | H03L 7/197 |
| | | | 375/376 |
| 2004/0013321 A1 | 1/2004 | Ohkawa | |
| 2007/0092986 A1* | 4/2007 | Chen | H01L 27/14609 |
| | | | 438/70 |
| 2011/0006817 A1* | 1/2011 | Han | G06F 1/08 |
| | | | 327/134 |
| 2011/0026083 A1 | 2/2011 | Nakazawa | |
| 2011/0316591 A1* | 12/2011 | Chang | H03K 3/84 |
| | | | 327/131 |
| 2013/0249609 A1* | 9/2013 | Taki | H03L 7/089 |
| | | | 327/156 |
| 2014/0029646 A1* | 1/2014 | Foxcroft | H04B 15/04 |
| | | | 375/146 |
| 2016/0049947 A1* | 2/2016 | Adachi | H03L 7/189 |
| | | | 327/159 |

FOREIGN PATENT DOCUMENTS

| | | |
|---|---|---|
| JP | 2011-035558 | 2/2011 |
| JP | 2011-061705 | 3/2011 |
| JP | 2012-119879 | 6/2012 |
| JP | 2012-249260 | 12/2012 |
| JP | 2013-080089 | 5/2013 |
| JP | 2013-201628 | 10/2013 |

\* cited by examiner

SPREAD SPECTRUM CLOCK GENERATOR, ELECTRONIC APPARATUS, AND SPREAD SPECTRUM CLOCK GENERATION METHOD

CROSS-REFERENCE TO RELATED APPLICATIONS

This patent application is based on and claims priority pursuant to 35 U.S.C. §119(a) to Japanese Patent Application Nos. 2014-204495, filed on Oct. 3, 2014 and 2015-143581, filed on Jul. 21, 2015 in the Japan Patent Office, the entire disclosures of which are hereby incorporated by reference herein.

BACKGROUND

Technical Field

The present invention relates to a spread spectrum clock generator, an electronic apparatus incorporating the spread spectrum clock generator, and a spread spectrum clock generation method.

Background Art

A spread spectrum clock is used to reduce electromagnetic interference (EMI).

However, in a phase-locked loop (PLL) that generates the spread spectrum clock, particularly using a center spread method, even using triangular wave data to control the frequency spread, it is possible to generate a phase error between the reference clock of the PLL and the spread spectrum clock.

To cope with this issue, in scanners and other imaging apparatuses that use a spread spectrum clock, to prevent image data fetch timing from shifting, a detection circuit at frequency level that uses a reference clock pulse generator and a counter using the spread spectrum clock is known.

SUMMARY

Embodiments of the present invention provide a novel spread spectrum clock generator that includes a phase comparator that compares a reference clock with a feedback clock, a low-pass filter that passes a predetermined low-frequency component from a signal of the comparison result, a phase lock loop that includes a voltage-controlled oscillator that generates an output clock whose frequency corresponds to the filtered signal, a triangular wave controller that generates a triangular wave signal for frequency-modulating the spread spectrum clock based on the output clock, a delay controller that generates the feedback clock by controlling delay of the output clock based on the triangular wave signal, a first counter that counts the output clock and outputs a first count value, a second counter that counts the reference clock and outputs a second count value, and a phase error correction circuit that compares the first count value with the second count value for period that is a cycle or a multiple of the cycle of the frequency modulation and corrects phase error of the output clock by modifying a shape of the triangular wave signal so that the first count value matches the second count value based on the comparison result.

Further embodiments of the present invention provide an electronic apparatus incorporating the spread spectrum clock generator and a spread spectrum clock generation method.

BRIEF DESCRIPTION OF THE DRAWINGS

A more complete appreciation of the disclosure and many of the attendant advantages thereof will be readily obtained as the same becomes better understood by reference to the following detailed description when considered in conjunction with the accompanying drawings.

DETAILED DESCRIPTION

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that have the same function, operate in a similar manner, and achieve a similar result.

In the embodiments described below, a spread spectrum clock generator using PLL that can resolve the above issue and reduce the phase error is provided.

Figure 1:
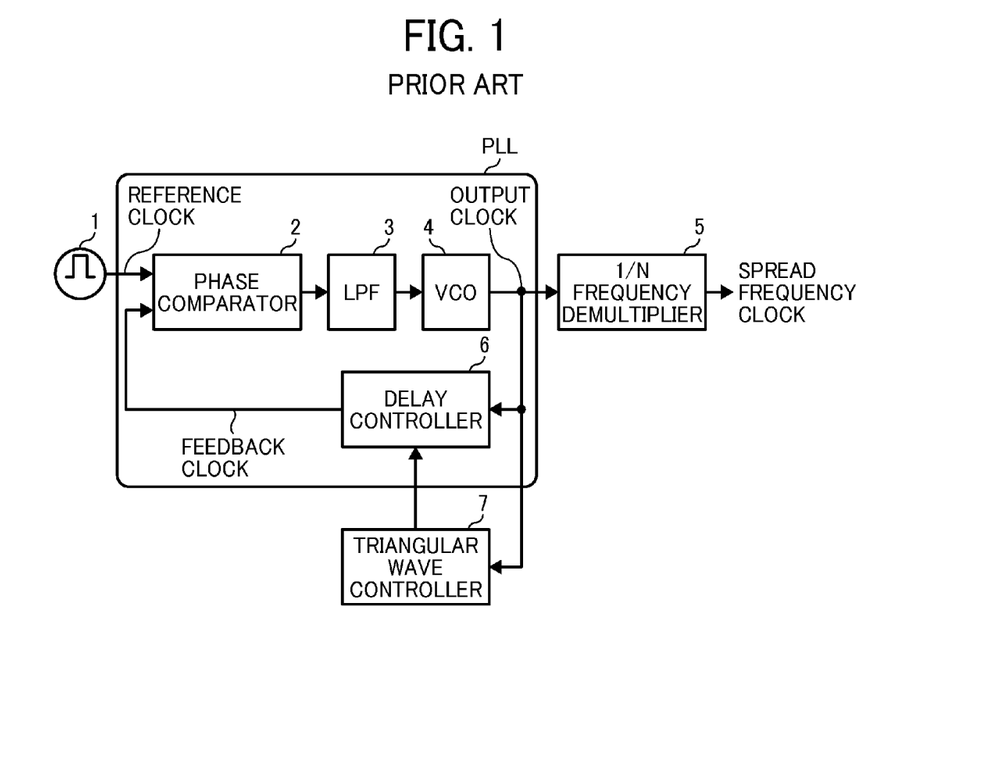
FIG. 1 is a block diagram illustrating a configuration of a conventional spread spectrum clock generator.

FIG. 1 is a block diagram illustrating a configuration of an existing spread spectrum clock generator. In FIG. 1, the spread spectrum clock generator includes a PLL. For example, the PLL includes a phase comparator 2, a lowpass filter (LPF) 3, a voltage-controlled oscillator (VCO) 4, and a delay controller 6. That is, the spread spectrum clock generator includes a reference clock generator 1, the phase comparator 2, the LPF 3, the VCO 4, a 1/N frequency demultiplier 5, the delay controller 6, and a triangular wave controller 7. The reference clock generator 1 generates a reference clock with a predetermined reference clock frequency and outputs the reference clock to the phase comparator 2. The phase comparator 2 compares a phase of the input reference clock with a phase of a feedback clock and outputs a voltage signal that indicates a phase comparison result to the LPF 3. The LPF 3 performs filtering so that a predetermined low-frequency component among voltage signals indicating the phase comparison result is passed and outputs it to the VCO 4. The VCO 4 generates an output clock with a frequency corresponding to an input voltage and outputs it to the 1/N frequency demultiplier 5, the delay controller 6, and the triangular wave controller 7. The 1/N frequency demultiplier 5 divides the input output clock by N and outputs the spread frequency clock after the division. The triangular wave controller 7 generates a triangular wave signal for modulating frequency of the spread spectrum clock synchronizing the output clock based on the input output clock and outputs it to the delay controller 6. The delay controller 6 generates a feedback clock for modulating frequency by delay-controlling the input output clock in accordance with the triangular wave signal from the triangular wave controller 7 and outputs it to the phase comparator 2. A 1/M frequency demultiplier that divides the output clock output by the VCO 4 by M is located anterior or posterior to the delay controller 6. If the 1/M frequency demultiplier is located anterior to the delay controller 6, it is possible to input the output clock from the 1/M frequency demultiplier to the triangular wave controller 7 or input the clock input to the 1/M frequency demultiplier to the triangular wave controller 7. Here, N and M are natural numbers equal to or more than two for example.

Figure 2:
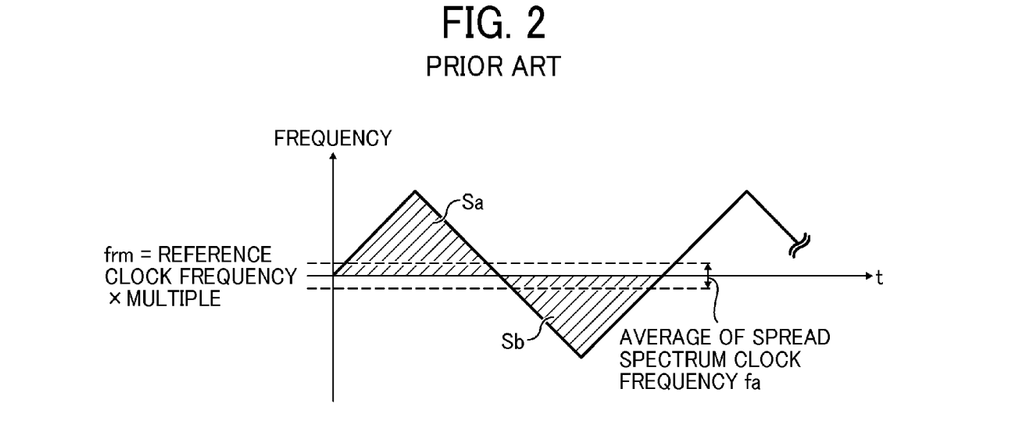
FIG. 2 is a diagram illustrating a triangular wave signal for frequency modulation generated by the spread spectrum clock generator shown in FIG. 1.

FIG. 2 is a diagram illustrating a triangular wave signal for frequency modulation to explain a problem with the spread spectrum clock generator in FIG. 1.

As shown in FIG. 2, it is common to use the triangular wave signal to modulate frequency for spreading spectrum. The spread spectrum clock generator makes an area $S_a$ plus-side (upper-side) and an area $S_b$ minus-side (lower-side) (in this case, each value corresponds to an integrated value or its absolute value) against a centerline of a level of the triangular wave signal equal. As a result, ideally an average frequency of the spread spectrum clock matches the frequency corresponding to the centerline of the level. That is, ideally, the centerline of the triangular wave signal corresponds to a reference frequency $f_{rm}$ of the spread spectrum clock (i.e., the reference clock frequency*a multiple). However, as shown in FIG. 2, in the actual circuit, the average frequency of the spread spectrum clock is offset from the centerline of the level within the range of an average value of the spread spectrum clock frequency $f_a$ for example due to circuit characteristics.

Furthermore, in the spread spectrum clock generator using the center spread method that multiplies the reference clock by a multiple, it is preferable that the average frequency of the spread spectrum clock matches the reference frequency $f_{rm}$ indicated by x-axis in FIG. 2. However, actually, due to analog characteristics of the LPF 3 and circuit characteristics of the delay controller 6 in FIG. 1, even if the ideal triangular wave signal is used for delay control of the spread spectrum clock, usually the result is above the x-axis or below the x-axis. Here, in the ideal triangular wave signal, the area $S_a$ on the plus-side of the reference frequency $f_{rm}$ of the spread spectrum clock in FIG. 2 is the same as the area $S_b$ on the minus-side of the reference frequency $f_{rm}$ (i.e., their absolute integrated values are the same). In this case, if an ideal average frequency is achieved using the LPF 3 as an analog circuit with an attached analog circuit or the delay control circuit, typically the scale of the circuit is increased. Embodiment 1 In this embodiment, to resolve the issue, the spread spectrum clock generator controls the area $S_a$ (integrated value) on the plus-side of the triangular wave signal or the area $S_b$ (absolute integrated value) on the minus-side of the triangular wave signal to minimize the shift in the spread spectrum clock frequency. As a result, the spread spectrum clock generator realizes the frequency close to the ideal average frequency. That is, in the spread spectrum clock generator using the center spread method, characteristics of the spread spectrum clock generator that minimizes the phase shift of the spread spectrum clock generator (i.e., divergence between the average frequency and the multiplied reference clock frequency) are described below.

Figure 3:
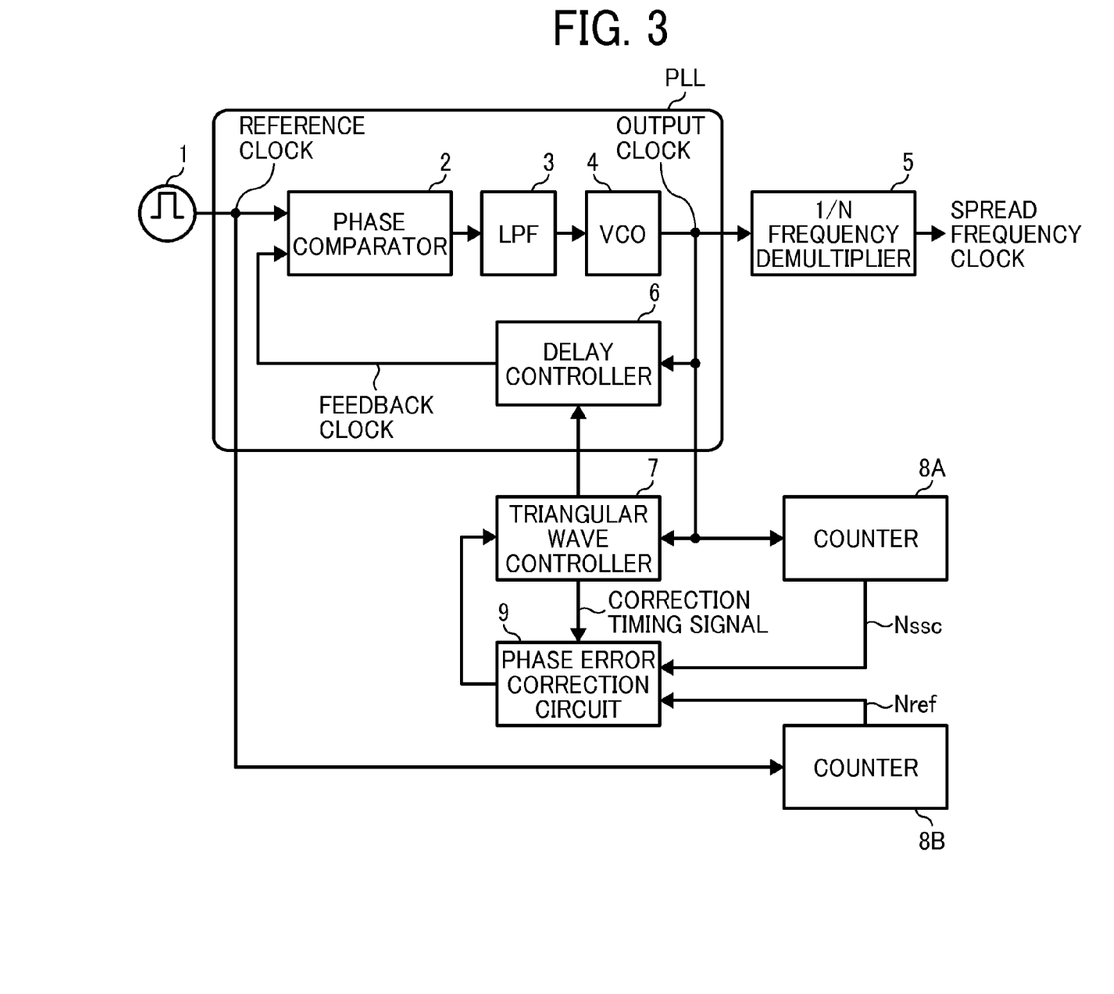
FIG. 3 is a block diagram illustrating a configuration of a spread spectrum clock generator as an embodiment of the present invention.

In the spread spectrum clock generator in this embodiment, for each predetermined modulation period, a counter 8A in FIG. 3 as an example of a first counter counts pulses of the output clock from the VCO 4 as a count value $N_{ssc}$ as an example of a first count value. In addition, in the spread spectrum clock generator, a counter 8B in FIG. 3 as an example of a second counter counts pulses of the reference clock to acquire an ideal count value as a count value $N_{ref}$ as an example of a second count value, and the count value $N_{ssc}$ is compared with the count value $N_{ref}$.

In the description below, the frequency of the output clock corresponding to the count value $N_{ssc}$ is referred to as an average frequency, and the frequency corresponding to the count value $N_{ref}$ is referred to as an ideal frequency. If it is determined that the average frequency is more than the ideal frequency, the spread spectrum clock generator generates the triangular wave signal used for controlling spread spectrum whose integrated value on the plus-side is smaller than the absolute integrated value on the minus-side. By contrast, if it is determined that the average frequency is less than the ideal frequency, the spread spectrum clock generator generates the triangular wave signal used for controlling spread spectrum whose integrated value on the plus-side is larger than the absolute integrated value on the minus-side.

FIG. 3 is a block diagram illustrating a configuration of a spread spectrum clock generator in this embodiment.

For example, the spread spectrum clock generator in the embodiment in FIG. 3 includes a PLL including the phase comparator 2, the LPF 3, the VCO 4, and the delay controller 6. Furthermore, the spread spectrum clock generator includes the 1/N frequency demultiplier 5, and the triangular wave controller 7. By comparison with the spread spectrum clock generator in FIG. 1, the spread spectrum clock generator in this embodiment further includes two counters 8A and 8B and a phase error correction circuit 9. More specifically, the output clock from the VCO 4 is input to the counter 8A, and the counter 8A counts pulses of the input output clock to output the count value $N_{ssc}$ to the phase error correction circuit 9. The reference clock from the reference clock generator 1 is input to the counter 8B, and the counter 8B counts pulses of the input reference clock to output the count value $N_{ref}$ to the phase error correction circuit 9. Subsequently, based on a correction timing signal from the triangular wave controller 7, the phase error correction circuit 9 compares the input count value $N_{ssc}$ with the input count value $N_{ref}$ at timing of the correction timing signal. Accordingly, based on a difference between the count values, the phase error correction circuit 9 modifies a shape of the triangular wave signal to minimize the difference, and the phase error correction circuit 9 corrects the phase error of the output clock. In this case, the correction timing signal is output for each period of a frequency modulation period of spreading spectrum, or the correction timing signal is output for period that is a cycle or a multiple of the cycle of the frequency modulation period. An example of the correction timing signal is a pulse signal.

A 1/M frequency demultiplier that divides the output clock output by the VCO 4 by M is located anterior or posterior to the delay controller 6. If the 1/M frequency demultiplier is located anterior to the delay controller 6, it is possible to input the output clock from the 1/M frequency demultiplier to the triangular wave controller 7 or input the clock input to the 1/M frequency demultiplier to the triangular wave controller 7. In FIG. 3, it is also possible to input the clock from the 1/N frequency demultiplier 5 to the counter 8A. In this case, the 1/N frequency demultiplier is located posterior to the delay controller 6.

A process of correcting the phase error is described below with reference to FIG. 4.

Figure 4:
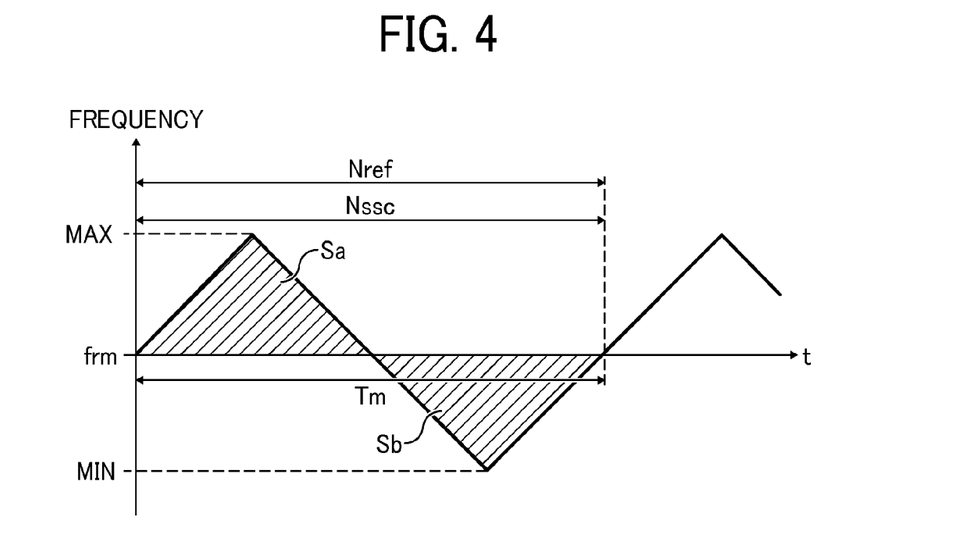
FIG. 4 is a diagram illustrating a waveform of the triangular wave signal for frequency modulation to explain a phase error correction process performed by a phase error correction circuit 9 in FIG. 3 as an embodiment of the present invention.

FIG. 4 is a diagram illustrating a waveform of the triangular wave signal for frequency modulation to explain the phase error correction process performed by the phase error correction circuit 9 in FIG. 3. A timing chart for generating the triangular wave signal and controlled parameters in this embodiment are described below with reference to FIG. 4.

(1) The count value $N_{ref}$ counts pulses of the reference clock.

(2) The count value $N_{ssc}$ counts pulses of the output clock.

(3) The area $S_a$ is the area of the triangular signal on the plus-side (integrated value).

(4) The area $S_b$ is the area of the triangular signal on the minus-side (absolute integrated value).

(5) A period Tm is a modulation period of spreading spectrum.

The phase error correction circuit 9 compares the count value $N_{ssc}$ with the count value $N_{ref}$ at a period of a frequency modulation period based on the correction timing signal. Subsequently, in accordance with the comparison result, the phase error correction circuit 9 performs a phase error correction process described below so that the count value $N_{ref}$ gets close to the count value $N_{ssc}$ (i.e., the frequency of the output clock $f_{ssc}$ gets close to the frequency of the reference clock $f_{ref}$ substantially). It should be noted that the correction timing signal is generated by the triangular wave controller 7, and the correction timing signal indicates a start point and an end point of each period of the frequency modulation.

(A) If $N_{ssc}$ is smaller than $N_{ref}$ in the subsequent frequency modulation period, the phase error correction circuit 9 generates the triangular wave signal in which $S_a$ is larger than $S_b$. In this case, the difference between the areas $S_a$ and $S_b$ is determined by the difference between the count values $N_{ref}$ and $N_{ssc}$.

(B) If $N_{ssc}$ is larger than $N_{ref}$ in the subsequent frequency modulation period, the phase error correction circuit 9 generates the triangular wave signal in which $S_a$ is smaller than $S_b$. In this case, the difference between the areas $S_a$ and $S_b$ is determined by the difference between the count values $N_{ref}$ and $N_{ssc}$.

For example, it is assumed that the reference clock frequency is 33.33 MHz and the multiple is 16. In this case, the reference frequency $f_{rm}$ of the spread spectrum clock in FIG. 4 becomes 33.33*16=533.28 MHz.

Furthermore, as shown in FIG. 4, the phase error correction circuit 9 modulates frequency between a range of a maximum frequency MAX in FIG. 4 and a minimum frequency MIN in FIG. 4 calculated from the reference frequency $f_{rm}$ and a modulation factor. For example, assuming that the modulation factor is ±3%, the maximum frequency MAX 533.28*1.03 is nearly equal to 549.3 MHz. Similarly, the minimum frequency MIN 533.28*0.97 is nearly equal to 517.3 MHz. It should be noted that the reference clock frequency, the reference frequency of the spread spectrum clock $f_{rm}$, the multiple, the modulation factor, the maximum frequency MAX, and the minimum frequency MIN are not limited to the above values and can be other values.

Accordingly, the phase error correction circuit 9 implements the phase error correction process performed by performing the above comparison etc. for each period of the frequency modulation period.

Figure 5:
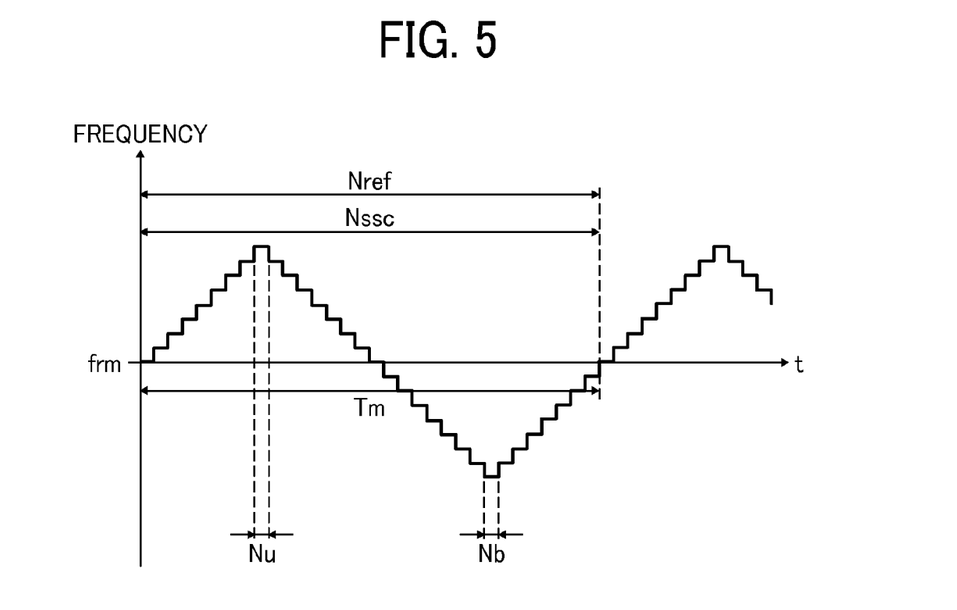
FIG. 5 is a diagram illustrating a waveform of the digital triangular wave signal for frequency modulation to explain a phase error correction process performed by a phase error correction circuit 9 in FIG. 3 as another embodiment of the present invention.

As described above, in this embodiment, the phase error correction circuit 9 compares the count value $N_{ssc}$ with the count value $N_{ref}$ for each frequency modulation period. Subsequently, in accordance with the comparison result, the phase error correction circuit 9 performs the phase error correction process so that the count value $N_{ref}$ gets close to the count value $N_{ssc}$ (i.e., the frequency of the output clock $f_{ssc}$ gets close to the frequency of the reference clock $f_{ref}$ substantially). As a result, in the spread spectrum clock generator using the PLL, it is possible to minimize the phase error, and it is possible that the frequency of the spread spectrum clock gets close to the frequency of the reference clock substantially. Embodiment 2 FIG. 5 is a diagram illustrating a waveform of the digital triangular wave signal for frequency modulation to explain a phase error correction process performed by a phase error correction circuit 9 in this embodiment. The delay controller 6 in this embodiment has levels changing in stages and includes a digital circuit that generates a digital triangular wave signal with a maximum value period and a minimum value period. The triangular wave controller 7 changes the frequency of the digital triangular wave signal in stages based on the result of comparing the count value $N_{ssc}$ with the count value $N_{ref}$. In FIG. 5, $N_u$ indicates the maximum value period of the digital triangular wave signal (i.e., a period that the digital triangular wave signal maintains the same maximum value $nT_c$ (initial value)), and $N_b$ indicates the minimum value period of the digital triangular wave signal (i.e., a period that the digital triangular wave signal maintains the same minimum value $nT_c$ (initial value)). Here, $T_c$ indicates the period of the spread spectrum clock, and n is a natural number equal to or larger than 2.

The phase error correction circuit 9 performs a phase error correction process shown below for each period of the frequency modulation period. (A) If $N_{ssc}$ is smaller than $N_{ref}$, in the subsequent frequency modulation period, the phase error correction circuit 9 generates the triangular wave signal whose maximum value period $N_u$ is $(n+1)T_c$. (B) If $N_{ssc}$ is larger than $N_{ref}$, in the subsequent frequency modulation period, the phase error correction circuit 9 generates the triangular wave signal whose minimum value period $N_b$ is $(n+1)T_c$.

Next, in case of performing the above operation, in the subsequent correction timing (after time Tm expires), (C) if $N_{ssc}$ is smaller than $N_{ref}$ and the operation (B) was performed in the previous correction, the phase error correction circuit 9 generates the triangular wave signal whose minimum value period $N_b$ is $(n-1)T_c$ in the subsequent frequency modulation period. Otherwise, the phase error correction circuit 9 performs the operation (A). (D) If $N_{ssc}$ is larger than $N_{ref}$ and the operation (A) was performed in the previous correction, in the subsequent frequency modulation period, the phase error correction circuit 9 generates the triangular wave signal whose maximum value period $N_u$ is $(n-1)T_c$. Otherwise, the phase error correction circuit 9 performs the operation (B).

Accordingly, the phase error correction circuit repeats the operations described above.

As described above, in this embodiment, the phase error correction circuit 9 compares the count value $N_{ssc}$ with the count value $N_{ref}$ for each frequency modulation period. Subsequently, in accordance with the comparison result, the phase error correction circuit 9 performs the phase error correction process so that the count value $N_{ref}$ gets close to the count value $N_{ssc}$ (i.e., the frequency of the output clock $f_{ssc}$ gets close to the frequency of the reference clock $f_{ref}$ substantially). As a result, in the spread spectrum clock generator using the PLL, the spread spectrum clock generator can reduce the phase error and get the frequency of the spread spectrum clock close to the frequency of the reference clock substantially.

Figure 6:
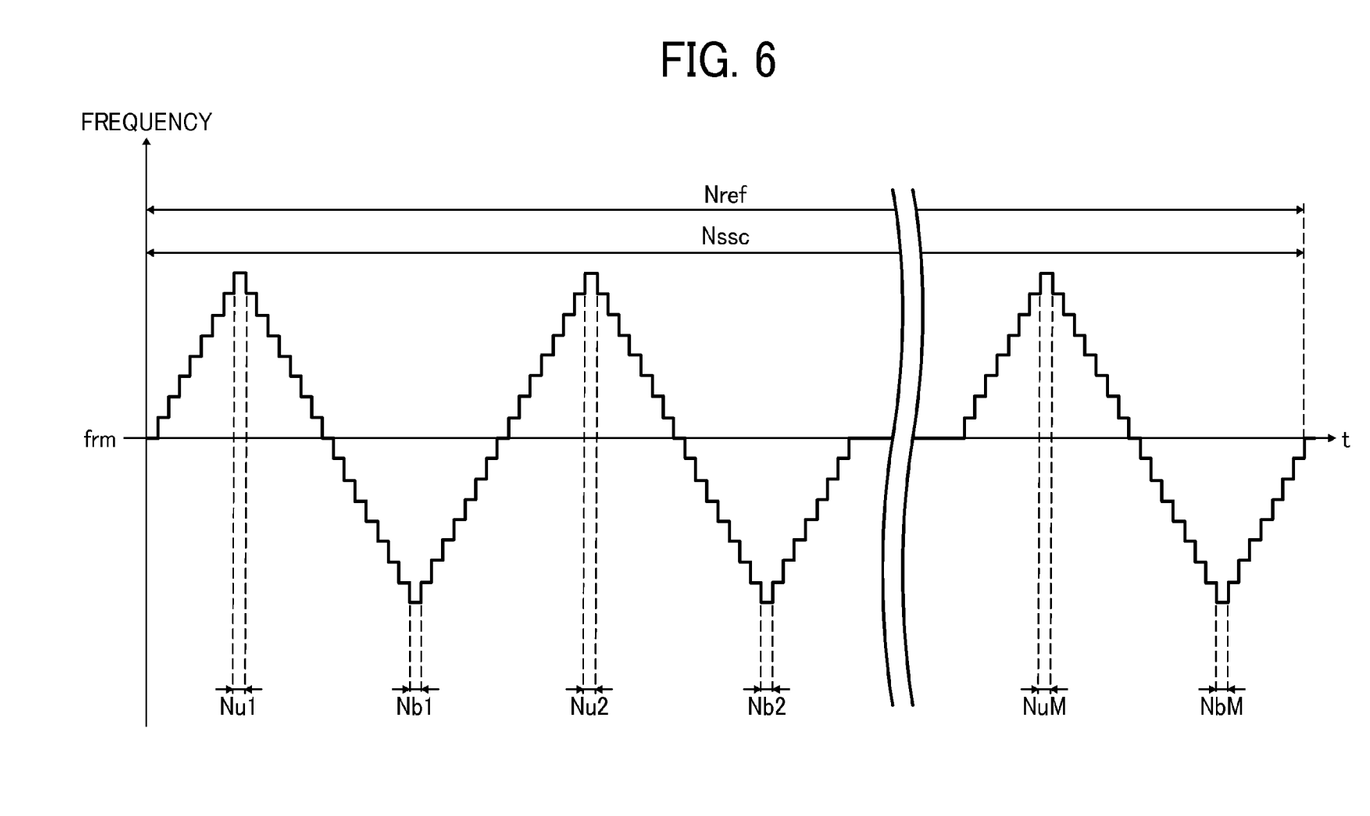
FIG. 6 is a diagram illustrating a waveform of the digital triangular wave signal for frequency modulation to explain a phase error correction process performed by a phase error correction circuit 9 in FIG. 3 as yet another embodiment of the present invention.

In this embodiment, in the operation (B), if $N_{ssc}$ is larger than $N_{ref}$ in the subsequent frequency modulation period, the phase error correction circuit 9 generates the triangular wave signal whose minimum value period $N_b$ is $(n+1)T_c$. It should be noted that the case described above is an example, and it is possible that the phase error correction circuit 9 generates the triangular wave signal whose maximum value period $N_u$ is $(n-1)T_c$. Embodiment 3 FIG. 6 is a diagram illustrating a waveform of the digital triangular wave signal for frequency modulation to explain a phase error correction process performed by the phase error correction circuit 9 in this embodiment. In the embodiments 1 and 2, the phase error correction process is performed for each period of the frequency modulation period. However, in this embodiment, the phase error correction circuit 9 performs the phase error correction process for each period that the frequency modulation period is multiplied by a multiple M. Here, the phase error correction process performed by the phase error correction circuit 9 is the same as in the embodiments 1 and 2 for example.

In this case, the phase error correction circuit 9 generates the digital triangular wave signal whose maximum value period $N_{b1}$ or minimum value period $N_{u1}$ is $(n+1)T_c$. Subsequently, at the timing of subsequent correction timing (after time M*Tm expires) (C) If $N_{ssc}$ is smaller than $N_{ref}$ and the digital triangular wave signal whose maximum value period $N_{u1}$ is $(n+1)T_c$ was generated in the previous correction, the phase error correction circuit 9 generates the digital triangular wave signal whose minimum value period $N_{b2}$ is $(n-1)T_c$. Otherwise, the phase error correction circuit 9 generates the digital triangular wave signal whose maximum value period $N_{u2}$ is $(n+1)T_c$. (D) If $N_{ssc}$ is larger than $N_{ref}$ and the digital triangular wave signal whose minimum value period $N_{b1}$ is $(n-1)T_c$ was generated in the previous correction, the phase error correction circuit 9 generates the digital triangular wave signal whose minimum value period $N_{b1}$ is $(n+1)T_c$. Otherwise, the phase error correction circuit 9 generates the digital triangular wave signal whose maximum value period $N_{u2}$ is $(n-1)T_c$.

That is, at the correction timing, the phase error correction circuit 9 increases or decreases any one of parameters, the maximum value periods $N_{u1}$ to $N_{uM}$ and the minimum value periods $N_{b1}$ to $N_{bM}$. As a result, in the spread spectrum clock generator with a characteristic that has less phase shift (average frequency shift) including its analog characteristics, if rapid change occurs, transition of the average frequency tends to have a characteristic of the triangular wave. The spread spectrum clock generator with the characteristics described above can implement an ideal average frequency with gradual change by performing the operation in this embodiment. As a result, the average frequency for each modulation period transitions gradually.

This embodiment implements the same effect as the embodiments 1 and 2.

In the embodiments described above, the digital triangular wave signal whose maximum value period $N_b$ or minimum value period $N_u$ is $(n+1)T_c$ or $(n-1)T_c$ is generated. However, the case described above is an example, and other integer numbers with the same sign can be used for "+1" or "−1" described above. That is, the maximum value period $N_b$ or the minimum value period $N_u$ described above can be increased or decreased.

In this embodiment, for each period that the frequency modulation is multiplied, the phase error correction circuit 9 can change at least any one of the maximum value period and the minimum value period of the digital triangular wave signal among multiple digital triangular wave signals included in the multiplied period.

As described above, in the embodiments described above, the phase error correction circuit 9 can reduce the phase error and get the average frequency of the spread spectrum clock generator using the center spread method close to the ideal frequency.

Furthermore, an application example such as an image processing apparatus that uses a timing generator (TG) including the spread spectrum clock generator described above is described below.

Figure 7:
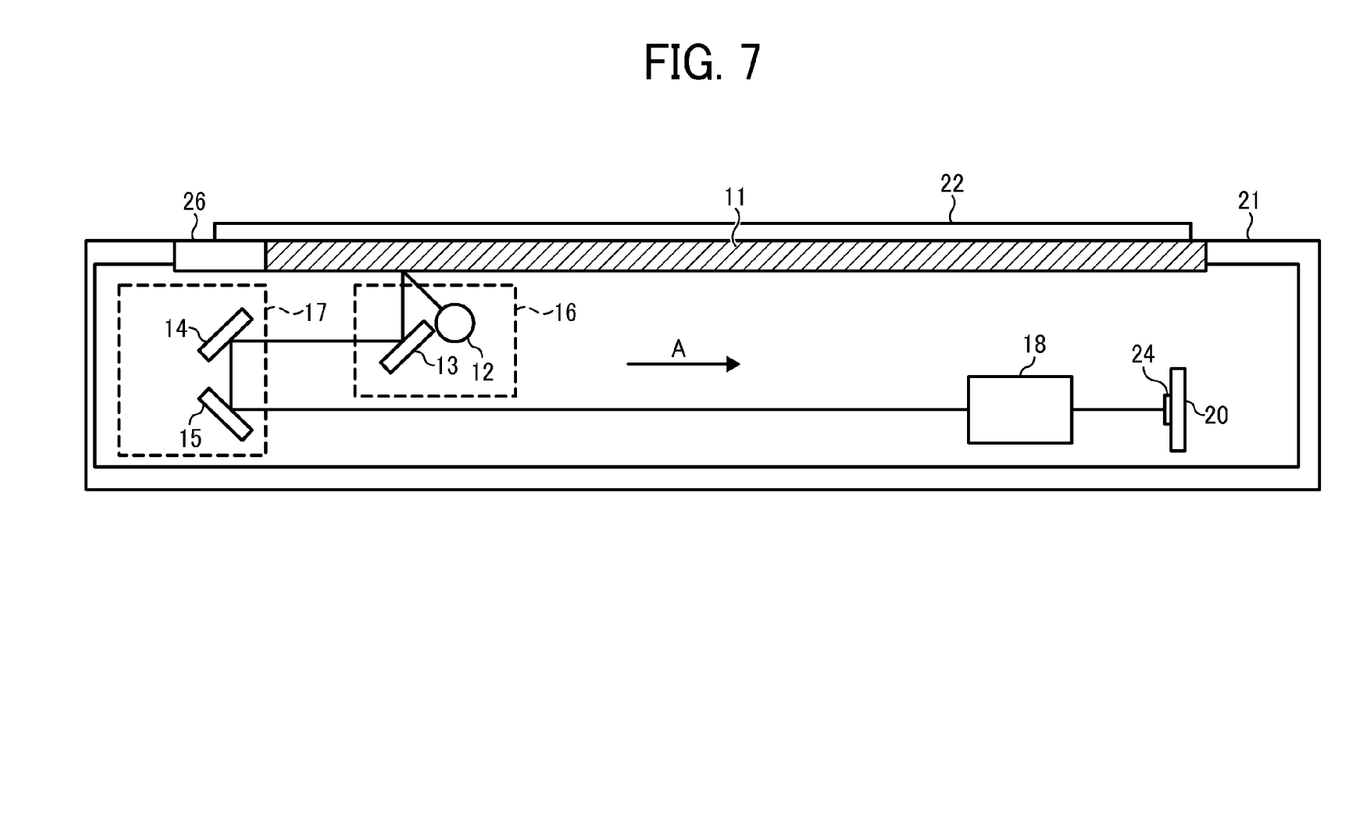
FIG. 7 is a schematic diagram illustrating a configuration of a scanner that includes a timing generator using the spread spectrum clock generator in FIG. 3.

FIG. 7 is a schematic diagram illustrating a configuration of a scanner that includes the TG using the spread spectrum clock generator in FIG. 3.

A scanner 21 in FIG. 7 uses a flatbed method, and a contact glass 11 on which a document is set is mounted on the upper part of the main unit. Below the contact glass 11, a first carriage 16 and a second carriage 17 are located so that the first carriage 16 moves at double the speed of the second carriage 17 in the direction of arrow A (sub-sub-scanning direction). Furthermore, a halogen lamp 12 as a light source and a first mirror 13 are mounted on the first carriage 16, and a second mirror 14 and a third mirror 15 are mounted on the second carriage 17. Reflected light from the document emitted by the halogen lamp 12 is reflected by the first mirror 13, the second mirror 14, and the third mirror 15 sequentially and enters into an imaging lens 18. Subsequently, the imaging lens focuses the reflected light to form an image on an image-forming surface of a CCD image sensor 24. After that, in the CCD image sensor 24, a sensor board 20 converts a photoelectric-converted analog electric signal into a digital electric signal, and it is transferred to a posterior step. The reason why the first carriage 16 moves at double the speed of the second carriage 17 in the sub-scanning direction is to keep an optical path length from the surface of the document to the image-forming surface of the CCD image sensor 24 constant, and the CCD image sensor 24 is mounted on the sensor board 20.

An openably closable pressure plate 22 is located so that the upper surface of the contact glass 11 is covered, and outside light does not enter the CCD image sensor 24 when the document is set on the contact glass 11. It is possible to include an automatic document feeder (ADF) or an automatic reversing document feeder (ARDF) to feed the document instead of the pressure plate 22. On the pressure plate 22, a reference whiteboard 26 is located at a home position side of the first carriage 16 and the second carriage 17 to be used for shading correction.

Figure 8:
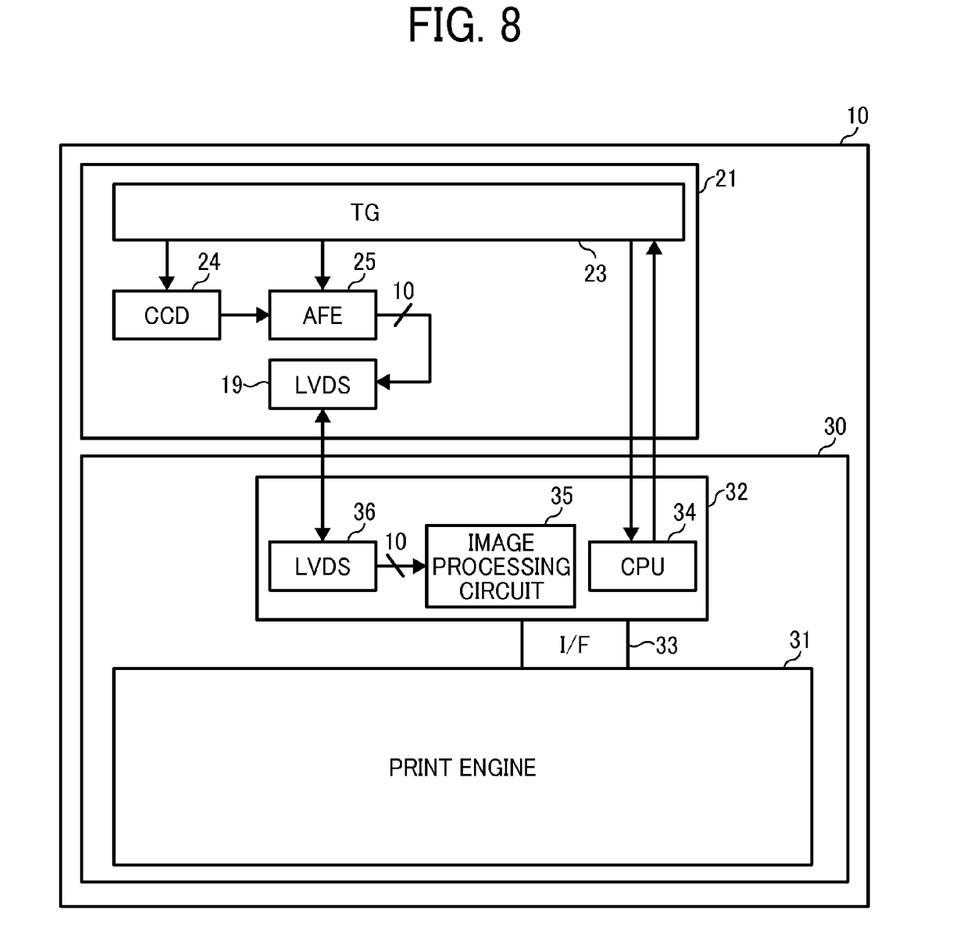
FIG. 8 is a schematic diagram illustrating a configuration of an image forming apparatus that includes the scanner in FIG. 7.

FIG. 8 is a schematic diagram illustrating a configuration of an image forming apparatus that includes the scanner in FIG. 7.

In FIG. 8, the image forming apparatus 10 includes the scanner 21 and a printer 30. The scanner 21 includes the TG 23, the CCD image sensor 24, and an analog front end (AFE) 25. Here, the AFE 25 transfers a 10-bit DOUT signal to a low voltage differential signaling (LVDS) 19.

On the other hand, the printer 30 includes a print engine 31 and a controller (print controller) 32 that controls the print engine 31, and the print engine 31 is connected to the print controller 32 via an interface (I/F) 33. The controller 32 includes a CPU 34, an image processing circuit 35, and a LVDS 36. The CPU 34 is connected to the TG 23 communicably, controls the print engine 31 based on an image signal input via the LVDS 36, and forms an image on a recording sheet. The print engine 31 can use various image forming processes, and print engines that use various image forming processes can be used. Therefore, a description of the print engine is omitted.

In addition to a copier and a single-function printer, the image forming apparatus 10 that includes the scanner 21 and the printer 30 can be applied to a digital multifunction peripheral (MFP) that includes multiple functions such as a copy function, print function, and facsimile function etc. These apparatuses are connected to a network and can output images in accordance with instructions from network terminal devices etc. connected to the network. The cases described in the embodiments can be applied to information processing apparatuses such as a facsimile and electronic apparatuses.

First, the CPU 34 loads a program stored in the ROM into the RAM. Subsequently, the CPU 34 executes the program using the RAM as a work area, controls the print engine 31, and performs an image forming process. The program is stored in a computer-readable recording medium such as a FD, CD, and DVD and used by reading the recording medium or being downloaded via the network.

In the embodiments described above, the scanner is taken as an example. The cases described in the above embodiments can be applied not only to scanners but also electronic apparatuses that include the spread spectrum clock generator described above.

For example, if the embodiments are applied to electronic apparatuses such as a camera, the camera performs the spread spectrum process, and the camera transfers the image data converted into a serial signal. In transferring the image data, if the phase error is corrected by skipping a clock based on a synchronous signal etc., the electronic apparatus that includes the spread spectrum clock generator in the embodiments can allow the apparatus that receives the serial signal from the camera to recognize a correct frame rate.

In addition, if the embodiments are applied to electronic apparatuses that scan an image such as scanners, it is possible to prevent timing of scanning an image from shifting.

The present invention also encompasses a non-transitory recording medium storing a program that executes a spread spectrum clock generation method. The spread spectrum clock generation method includes the steps of performing filtering to pass a predetermined low-frequency component from a signal of the comparison result, including a voltage-controlled oscillator that generates an output clock whose frequency corresponds to the filtered signal, generating a triangular wave signal for frequency-modulating the spread spectrum clock based on the output clock, generating the feedback clock by controlling delay of the output clock based on the triangular wave signal, counting the output clock and output a first count value, counting the reference clock and output a second count value, and comparing the first count value with the second count value for period that is a cycle or a multiple of the cycle of the frequency modulation and correcting phase error of the output clock by modifying a shape of the triangular wave signal so that the first count value matches the second count value based on the comparison result.

Each of the functions of the described embodiments may be implemented by one or more processing circuits. A processing circuit includes a programmed processor, as a processor includes circuitry. A processing circuit also includes devices such as an application specific integrated circuit (ASIC) and conventional circuit components arranged to perform the recited functions.

Numerous additional modifications and variations are possible in light of the above teachings. It is therefore to be understood that, within the scope of the appended claims, the disclosure of this patent specification may be practiced otherwise than as specifically described herein.

As can be appreciated by those skilled in the computer arts, this invention may be implemented as convenient using a conventional general-purpose digital computer programmed according to the teachings of the present specification. Appropriate software coding can readily be prepared by skilled programmers based on the teachings of the present disclosure, as will be apparent to those skilled in the software arts. The present invention may also be implemented by the preparation of application-specific integrated circuits or by interconnecting an appropriate network of conventional component circuits, as will be readily apparent to those skilled in the relevant art.

Each of the functions of the described embodiments may be implemented by one or more processing circuits. A processing circuit includes a programmed processor. A processing circuit also includes devices such as an application specific integrated circuit (ASIC) and conventional circuit components arranged to perform the recited functions.

What is claimed is:

1. A spread spectrum clock generator, comprising:
   a phase comparator to compare a reference clock with a feedback clock to obtain a comparison result;
   a low-pass filter to pass a predetermined low-frequency component from a signal of the comparison result to obtain a filtered signal;
   a phase lock loop including a voltage-controlled oscillator that generates an output clock whose frequency corresponds to the filtered signal;
   a triangular wave controller to generate a triangular wave signal for frequency-modulating a spread spectrum clock based on the output clock;
   a delay controller to generate the feedback clock by controlling delay of the output clock based on the triangular wave signal;
   a first counter to count the output clock to output a first count value;
   a second counter to count the reference clock to output a second count value; and
   a phase error correction circuit to compare the first count value with the second count value for period that is a cycle or a multiple of the cycle of the frequency modulation and correct phase error of the output clock by modifying a shape of the triangular wave signal so that the first count value matches the second count value based on the comparison result.

2. The spread spectrum clock generator according to claim 1, wherein the triangular wave controller generates a correction timing signal, and the phase error correction circuit modifies the shape of the triangular wave signal for period that is a cycle or a multiple of the cycle of the frequency modulation indicated by the correction timing signal.

3. The spread spectrum clock generator according to claim 1, wherein the phase error correction circuit modifies the shape of the triangular wave signal by modifying at least one of an integrated value of a waveform above a centerline of the triangular wave signal and an integrated value of the waveform below the centerline of the triangular wave based on the comparison result.

4. The spread spectrum clock generator according to claim 1, wherein the triangular wave signal is a stepwise digital triangular wave signal including a maximum value period and a minimum value period, and the phase error correction circuit modifies the shape of the stepwise digital triangular wave signal by modifying at least one of the maximum value period and the minimum value period of the digital triangular wave signal based on the comparison result obtained by the phase comparator.

5. The spread spectrum clock generator according to claim 4, wherein the phase error correction circuit, in modifying the shape of the triangular wave signal for period that is a cycle or a multiple of the cycle of the frequency modulation, modifies the shape of the stepwise digital triangular wave signal by modifying at least any one of the maximum value period and the minimum value period of the same stepwise digital triangular wave signals or different digital triangular wave signals among multiple stepwise digital triangular wave signals included in the period that is a multiple of the cycle of the frequency modulation.

6. An electronic apparatus comprising the spread spectrum clock generator according to claim 1.

7. A spread spectrum clock generation method comprising the steps of:
- comparing a reference clock with a feedback clock to obtain a comparison result;
- performing filtering to pass a predetermined low-frequency component from a signal of the comparison result to obtain a filtered signal;
- employing a voltage-controlled oscillator that generates an output clock whose frequency corresponds to the filtered signal;
- generating a triangular wave signal for frequency-modulating a spread spectrum clock based on the output clock;
- generating the feedback clock by controlling delay of the output clock based on the triangular wave signal;
- counting the output clock and output a first count value;
- counting the reference clock and output a second count value; and
- comparing the first count value with the second count value for period that is a cycle or a multiple of the cycle of the frequency modulation and correcting phase error of the output clock by modifying a shape of the triangular wave signal so that the first count value matches the second count value based on the comparison result.

* * * * *